United States Patent [19]
Gupta et al.

[11] Patent Number: 5,822,245
[45] Date of Patent: Oct. 13, 1998

[54] DUAL BUFFER FLASH MEMORY ARCHITECTURE WITH MULTIPLE OPERATING MODES

[75] Inventors: Anil Gupta, San Jose; Steven J. Schumann, Sunnyvale, both of Calif.

[73] Assignee: Atmel Corporation, San Jose, Calif.

[21] Appl. No.: 824,175

[22] Filed: Mar. 26, 1997

[51] Int. Cl.⁶ .................................................. G11C 11/34
[52] U.S. Cl. ................................. 365/185.12; 365/185.33
[58] Field of Search ......................... 365/185.12, 185.33; 395/182.04

[56] References Cited

U.S. PATENT DOCUMENTS 5,533,190  7/1996  Binford et al. ..................... 395/182.04
5,572,660  11/1996  Jones .................................. 395/182.04

Primary Examiner—David C. Nelms
Assistant Examiner—Trong Phan
Attorney, Agent, or Firm—D'Alessandro & Ritchie

[57] ABSTRACT

A flash memory array architecture comprising a flash memory array, first and second memory buffer, and I/O interface circuit which has several operating modes which permit data to be read from the flash memory array, several operating modes which permit data to be programmed into the flash memory array, and a mode for rewriting the data in the flash memory array.

In the four read modes, one of the pages stored in the flash memory array is read, the data stored in either of first or second memory buffers is read, the data in one of the pages of data stored in the flash memory array is read and then written into either of first or second memory buffers, the data in one of the pages of data stored in the flash memory array is read and then compared to the data read from either of first or second memory buffers. In the four write modes, data from an input stream is written into a selected first or second memory buffer, one of the pages of data stored in the flash memory array is erased, and then in the same cycle, data in either of first or second memory buffers is written into the erased page in the flash memory array, data in either of first or second memory buffers is written into a previously erased page in the flash memory array, and data from an input stream is written into the selected first or second memory buffer, one of the pages of data stored in the flash memory array is erased, and then in the same cycle, data in either of first or second memory buffers is written into the erased page in the flash memory array. In the auto page rewrite mode, the data in one of the pages of data stored in the flash memory array is read and then written into either of first or second memory buffers. The data stored in the page of the flash memory array just read is erased, and then in the same cycle, the page of data stored in the selected first or second memory buffer is written into the erased page in the flash memory array.

52 Claims, 4 Drawing Sheets

DUAL BUFFER FLASH MEMORY ARCHITECTURE WITH MULTIPLE OPERATING MODES

BACKGROUND OF THE INVENTION

1. Field Of The Invention

The present invention relates to a flash memory array architecture. More particularly, the present invention relates to a flash memory array architecture employing dual buffers to provide multiple operating modes.

2. The Prior Art

Flash memory products are presently one of the fastest growing segments of the memory markets. The increased densities, low power, re-writable, and non-volatile aspects of flash memory have made it an attractive alternative to other types of memory products. Unfortunately, conventional flash memory products suffer from a lack of different read and write operating modes that can be employed to improve the utility of flash memory products.

In a conventional flash memory, the memory cells are arranged in an array of rows and columns, and a page mode operation is offered. In page mode operation data is first written into a row of latches, one latch for each column in the flash array, and then the data in the row of latches is programmed into a specific row in the array.

There are several limitations associated with the operations of a conventional flash array. One is the inability to read the data from the latches. Further, data which has been programmed into the flash array cannot be compared with the data in the latches to determine whether the data was programmed into the flash array correctly. Another limitation is that with only a single row of latches, the writing to the latches and the programming of the flash array do not occur separately. As a consequence, when the data is being programmed in the flash array, the latches are not available to have more data written into them.

Another limitation arises wherein the user of the flash array is not able to modify only a few bytes in a page of the flash array, without writing data into each of the latches of the flash array.

Accordingly, there is a need for additional operating modes in a flash memory array to provide the flash memory array with increased utility.

BRIEF DESCRIPTION OF THE INVENTION

In the present invention of a dual buffer flash memory array, there are several operating modes which permit data to be read from the flash memory array, several operating modes which permit data to be programmed into the flash memory array, and a mode for rewriting the data in the flash memory array.

In a first read mode, main memory page read, one of the pages stored in the flash memory array is read. In a second read mode, buffer read, the data stored in either of first or second memory buffers is read. In a third read mode, main memory page to buffer transfer, the data in one of the pages of data stored in the flash memory array is read and then written into either of first or second memory buffers. In a fourth read mode, main memory page to buffer compare, the data in one of the pages of data stored in the flash memory array is read and then compared to the data read from either of first or second memory buffers.

In a first write mode, buffer write, data from a serial or parallel input stream is written into the selected first or second memory buffer. In a second write mode, buffer transfer to main memory page with built-in erase, one of the pages of data stored in the flash memory array is erased, and then in the same cycle, data in either of first or second memory buffers is written into the erased page in the flash memory array. In a third write mode, buffer transfer to main memory page without built-in erase, data in either of first or second memory buffers is written into a previously erased page in the flash memory array. In a fourth write mode, main memory page program, data from the serial or parallel input stream is written into the selected first or second memory buffer. Next, one of the pages of data stored in the flash memory array is erased, and then in the same cycle, data in either of first or second memory buffers is written into the erased page in the flash memory array.

In an auto page rewrite mode, the data in one of the pages of data stored in the flash memory array is read and then written into either of first or second memory buffers. The data stored in the page of the flash memory array just read is erased, and then in the same cycle, the page of data stored in the selected first or second memory buffer is written into the erased page in the flash memory array.

DETAILED DESCRIPTION OF A PREFERRED EMBODIMENT

Figure 1:
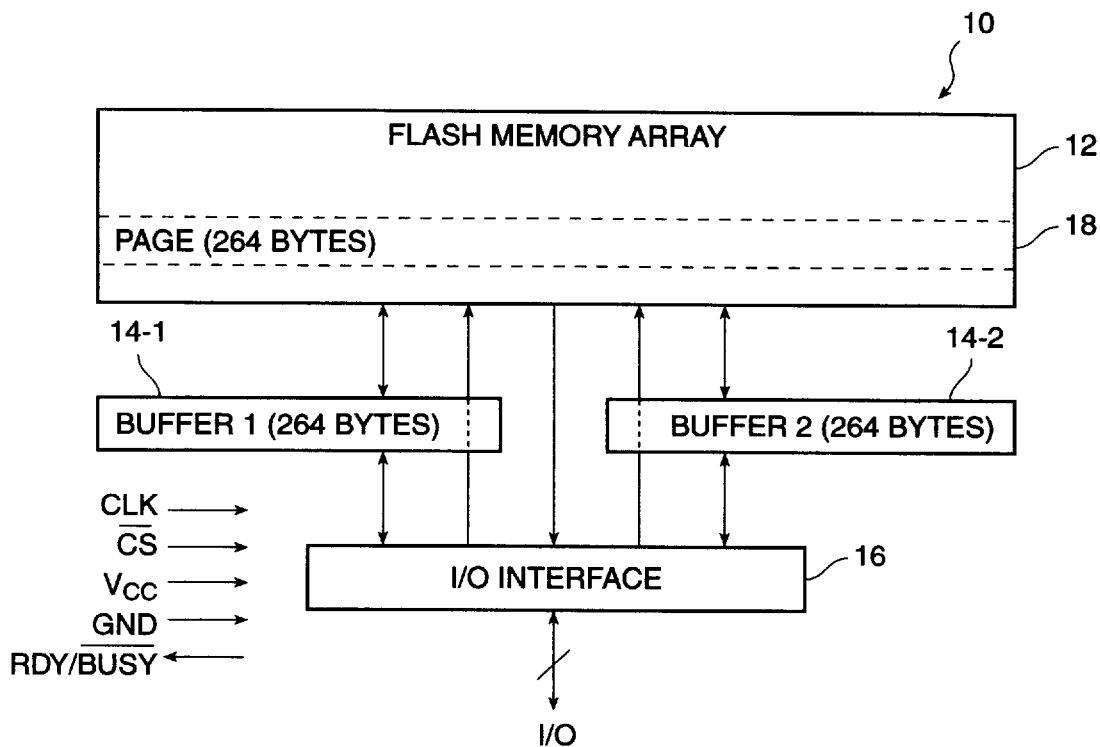
FIG. 1 illustrates a block diagram of a flash memory system according to the present invention.

Those of ordinary skill in the art will realize that the following description of the present invention is illustrative only and not in any way limiting. Other embodiments of the invention will readily suggest themselves to such skilled persons. It should also be appreciated that to avoid unnecessary duplication of reference numerals, elements in figures which correspond to the same elements in other figures may be given the same reference numeral in both figures.

FIG. 1 illustrates a block diagram of a flash memory system 10 according to the present invention. The flash memory system 10 includes a flash memory array 12, first and second memory buffers 14-1 and 14-2, and an input/output (I/O) interface circuit block 16. In the preferred embodiment, there are 4,325,376 bits of memory in the flash memory array 12 arranged as 2048 pages of 264 bytes. A representative page 18 is depicted in the flash memory array 12. It should be appreciated, however, that flash memory arrays different in size than that of the preferred embodiment are contemplated by the present invention.

To avoid overcomplicating the disclosure and thereby obscuring the present invention, the structure of the memory cells, and the connection of the memory cells to the flash memory array architecture, including word lines, bit lines, and common ground lines, will not be disclosed herein. A flash memory array 12 suitable for use in the present invention is disclosed in U.S. Pat. No. 4,783,766, assigned to the same assignee as the present invention, and hereby expressly incorporated herein by reference. It should be appreciated, however, by those of ordinary skill in the art that the present invention is not limited to the flash memory array 12 described in U.S. Pat. No. 4,783,766, and that other flash memory arrays known to those of ordinary skill in the art may be employed in the present invention.

In the preferred embodiment, the size of both of the memory buffers 14-1 and 14-2 are also 264 bytes. It should be appreciated, however, that it is contemplated by the present invention that the size of memory buffers 14-1 and 14-2 may differ in size from the page 18 size in the memory array 12. In the preferred embodiment, the memory buffers 14-1 and 14-2 are implemented as static random access memory (SRAM). Various implementations of SRAMs well known to those of ordinary skill in the art are suitable for use in the present invention. The I/O interface circuit block 16 is depicted in greater detail in FIGS. 2A–2E, and will be described in reference thereto.

Figure 2A:
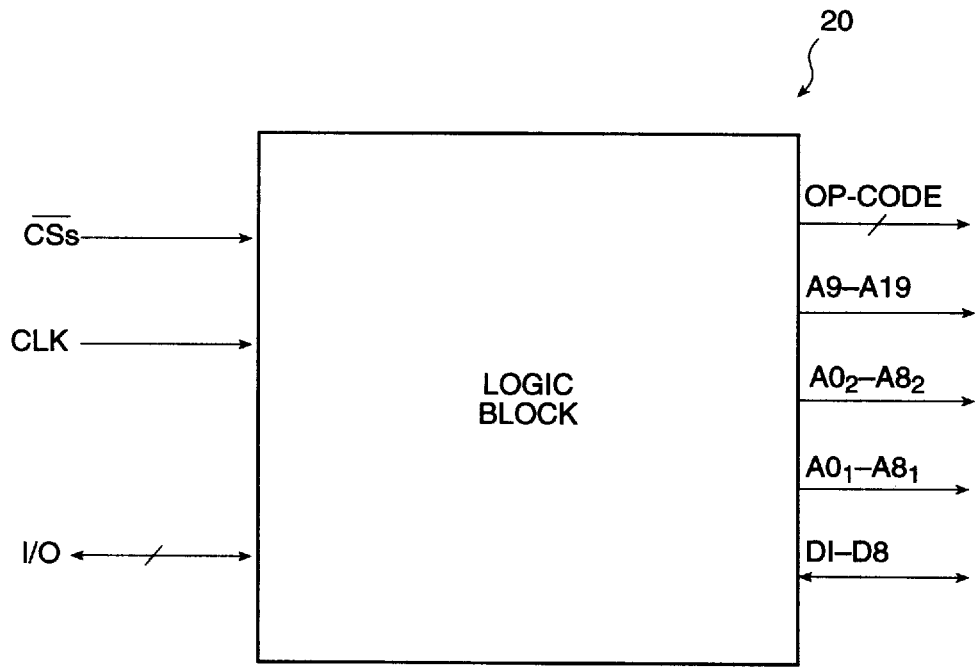
FIG. 2A illustrates a logic block in an I/O interface circuit according to the present invention.

In the present invention there are several modes which permit data to be read from the flash memory array 12, several modes which permit data to be programmed into the flash memory array 12, and a mode for rewriting the data in the flash memory array 12. For each of the operating modes, an active low chip select signal ($\overline{CS}$), an input stream, and a clock (CLK) are provided to a logic block 20 in the I/O interface circuit block 16 as depicted in FIG. 2A. According to first and second embodiments of the present invention, the input stream may be either serial or parallel. As will be appreciated by those of ordinary skill in the art, when the input stream is serial, N clock cycles will be required to input each N-bit byte, and when the input stream is parallel, one clock cycle will be required to input each N-bit byte. In the following discussion it should be understood that although input stream will be referred to generically, the input stream may be either serial or parallel.

The input stream, to be described below in greater detail with reference to each of the operating modes, includes operating mode instructions (op-code) and address information, and may also include input data. In the embodiment of a serial input stream, a circuit in the logic block 20, implementations of which are well known to those of ordinary skill in the art, will transform the serial input stream to a parallel input stream. In each of the operating modes, the op-code applied to the inputs of the logic block 20 will be decoded when the $\overline{CS}$ signal generated by the device employing the flash memory system 10 makes a transition from high to low. With the $\overline{CS}$ signal held low, the bytes 5 of information comprising the instruction are toggled into logic block 20 by a CLK also generated by the device employing the flash memory system 10. The op-code, address bits and data to be described below are output from logic block 20.

Figure 2B:
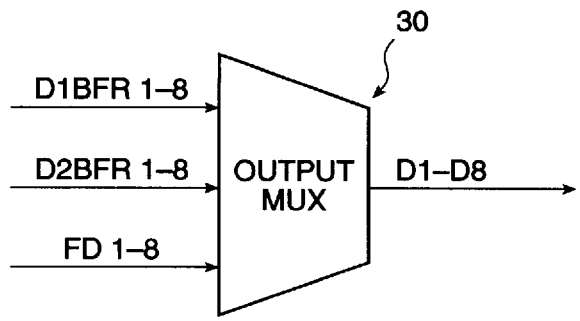
FIG. 2B illustrates an output multiplexer in an I/O interface circuit according to the present invention.
Figure 2C:
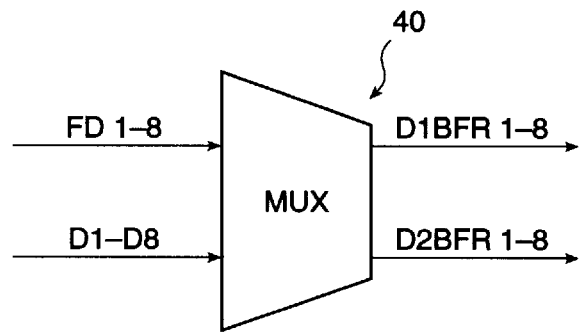
FIG. 2C illustrates an I/O multiplexer in an I/O interface circuit according to the present invention.
Figure 2D:
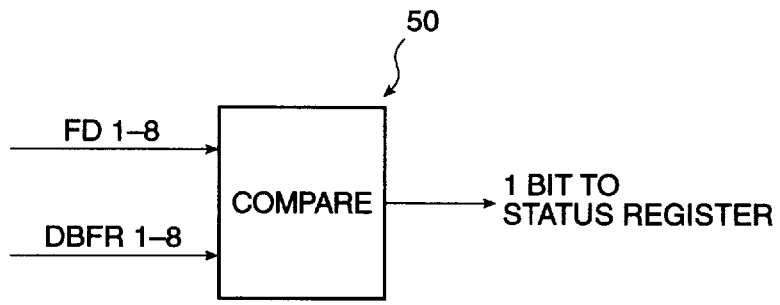
FIG. 2D illustrates a compare block in an 1/0 interface circuit according to the present invention.
Figure 2E:
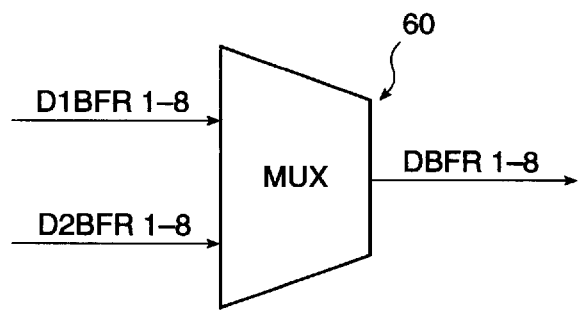
FIG. 2E illustrates a multiplexer in an I/O interface circuit according to the present invention.

In a first read mode, main memory page read, a multibyte instruction comprising an op-code specifying the main memory page read operation to be performed and an address are input to the logic block 20 in the input stream. In the main memory page read, one of the 2048 pages stored in the flash memory array 12 is read a byte at a time and multiplexed as FD1–8 through an output multiplexer (MUX) 30 of I/O interface circuit 16 as depicted in FIG. 2B. The output of MUX 30 is connected to the D1–D8 data bus connected to logic block 20. For the parallel output data stream embodiment, the data on the D1–D8 data bus is output from logic block 20 on parallel I/O lines, and for the serial output data stream embodiment, the data on the D1–D8 data bus is serialized and output from logic block 20 on a serial output line.

Figure 3A:
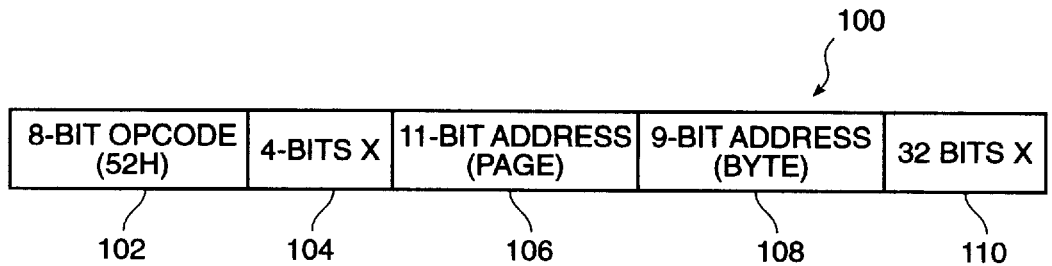
FIG. 3A is a diagram of a main memory read instruction according to the present invention.

A block diagram of the main memory read instruction 100 is illustrated in FIG. 3A. A first portion of the main memory read instruction 100 is an eight bit opcode 102. In the preferred embodiment, the opcode bit pattern is 52 in hexadecimal notation (52H). A second portion of the main memory read instruction 100 is four bits of don't care 104. The four bits of don't care 104 are not presently defined so that they may be available for future use. A third portion of the main memory read instruction 100 is eleven bits of address 106 specifying the address of the page to be read from the flash memory array 12. A fourth portion of the main memory read instruction 100 is nine bits of address 108 specifying the address of the first byte to be read from selected page in the flash memory array 12. A fifth portion of the main memory read instruction 100 is four bytes of don't care 110. The four bytes of don't care 110 are provided to give the flash memory array 12 sufficient time to initialize. It should be appreciated by those of ordinary skill in the art that in alternative embodiments, other numbers of bytes of don't care 110 may be employed.

Once the main memory read instruction 100 has been toggled in by the CLK, the op-code will be output from the logic block 20 along with the latched addresses $A0_1$–$A8_1$ A9–A19 specified by twenty bits of address at 106 and 108. The op-code enables the decoding of the address by the flash memory array 12 and the output of the data by the I/O interface circuit 16. An address decode suitable for use by the flash memory array 12 is within the level of skill of those of ordinary skill in the art. In the main memory read operation, the bytes of data are read one at a time in a sequential manner. If during the main memory page read operation, the end of the page specified by the nine bit address 108 is reached, the read operation will continue at the start of that page. The read operation will continue until the $\overline{CS}$ signal makes a transition from low to high. When the $\overline{CS}$ signal makes the transition from low to high the read stops, and the I/O of the logic block 20 will be placed in a high impedance state.

In a second read mode, buffer read, a multibyte instruction comprising an opcode specifying the buffer read operation to be performed and an address are input to the logic block 20 in the input stream. In the buffer read, the data stored in either of first or second memory buffers 14-1 or 14-2 is read a byte at a time and multiplexed through the inputs D1BFR1–8 or D2BFR1–8, respectively, of MUX 30 as depicted in FIG. 2B. The output of MUX 30 is connected to the D1–D8 data bus connected to logic block 20. For the parallel output data stream embodiment, the data on the D1–D8 data bus is output from logic block 20 on parallel I/O lines, and for the serial output data stream embodiment, the data on the D1–D8 data bus is serialized and output from logic block 20 on a serial output line.

Figure 3B:
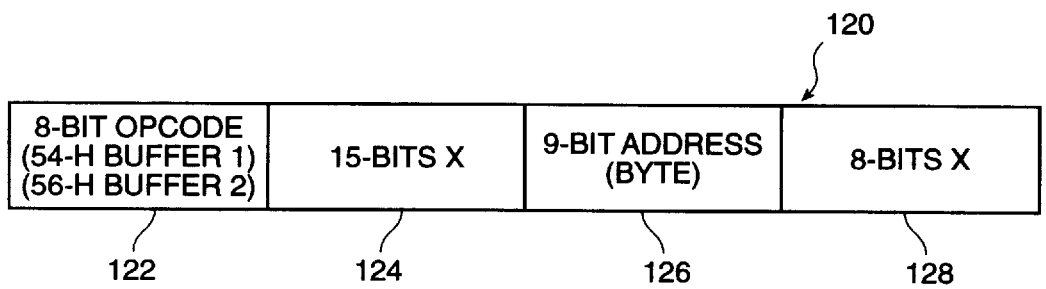
FIG. 3B is a diagram of a buffer read instruction according to the present invention.

A block diagram of the buffer read instruction 120 is illustrated in FIG. 3B. A first portion of the buffer read instruction 120 is an eight bit opcode 122. In the preferred embodiment, the opcode bit pattern to read from the first memory buffer 14-1 is 54H, and the opcode to read from the second memory read buffer 14-2 is 56H. A second portion of the buffer read instruction 120 is fifteen bits of don't care 124. A third portion of the buffer read instruction 120 is nine bits of address 126 specifying the address of the first byte to be read from the selected first or second memory buffer 14-1 or 14-2. A fourth portion of the buffer read instruction 120 is eight bits of don't care 128.

Once the buffer read instruction 120 has been toggled in by the CLK signal, the op-code will be output from the logic block 20 along with either the address $A0_1$–$8_1$ or $A0_2$–$8_2$ (depending on whether the read is from first or second memory buffer 14-1 or 14-2) specified by nine bits of address 126. In the buffer read operation, the bytes of data are read one at a time in a sequential manner. If the end of the selected first or second memory buffer 14-1 or 14-2 is reached during the buffer read operation, the read operation will then begin reading at the start of that memory buffer. The buffer read operation will continue until the $\overline{CS}$ signal makes a transition from low to high. When the $\overline{CS}$ signal makes the transition from low to high the read stops, and the I/O of the logic block 20 will be placed in a high impedance state.

In a third read mode, main memory page to buffer transfer, a multibyte instruction comprising an opcode specifying the main memory page to buffer transfer operation to be performed and the selected first or second memory buffer 14-1 or 14-2, and the address of the page in the flash memory array 12 are input to the logic block 20 in the input stream. In the main memory page to buffer transfer, the data in one of the 2048 pages of data stored in the flash memory array 12 is read and multiplexed through MUX 40 depicted in FIG. 2C, and written into either of first or second memory buffers 14-1 or 14-2.

Figure 3C:
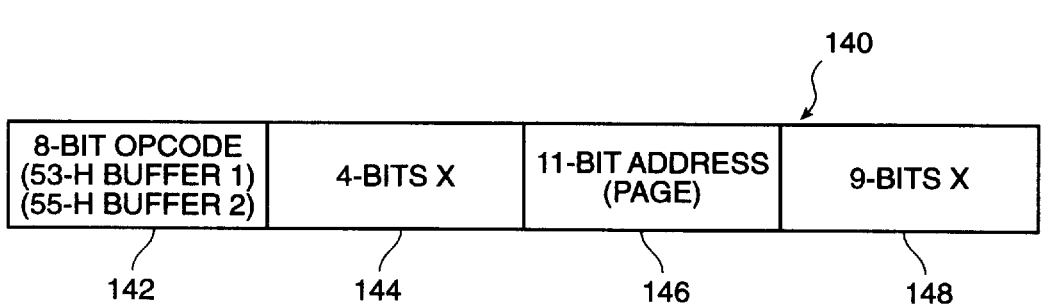
FIG. 3C is a diagram of a main memory page to buffer transfer instruction according to the present invention.

A block diagram of the main memory page to buffer transfer instruction 140 is illustrated in FIG. 3C. A first portion of the main memory to buffer transfer instruction 140 is an eight bit opcode 142. In the preferred embodiment, the opcode bit pattern to implement a transfer from the flash memory array 12 to the first memory buffer 14-1 is 53H, the opcode bit pattern to implement a transfer from the flash memory array 12 to the second memory buffer 14-2 is 55H. A second portion of the main memory page to buffer transfer instruction 140 is four bits of don't care 144. A third portion of the main memory page to buffer transfer instruction 140 is eleven bits of address 146 specifying the address of the page in the flash memory array 12 to be read, and then written into the selected first or second memory buffer 14-1 or 14-2. A fourth portion of the main memory page to buffer transfer instruction 140 is nine bits of don't care 148.

Once the main memory page to buffer transfer instruction 140 has been toggled in by CLK, the opcode will be output from the logic block 20 along with the page address A9–A19 specified by eleven bits of address 146. The address will be decoded by the flash memory array 12, and on a transition from low to high of the $\overline{CS}$ signal, a transfer of the page in the flash memory array 12 specified by eleven bits of address 146 will be made to the selected first or second memory buffer 14-1 or 14-2. In the preferred embodiment, the data transfer is typically completed in about 120 µs. The most significant bit in a status register (not shown) can be checked to assess whether the data transfer has been completed. Alternatively, it should be appreciated from FIG. 1 that when a programming, compare or page-to-buffer transfer operations is being performed, the RDY/$\overline{BUSY}$ pin can be checked to assess whether the operation has been completed.

In a fourth read mode, main memory page to buffer compare, a multibyte instruction comprising an opcode specifying the main memory page to buffer compare operation to be performed and the selected first or second memory buffer 14-1 or 14-2, and the address of the page in the flash memory array 12 are input to the logic block 20 in the input stream. In the main memory page to buffer compare, the data in one of the 2048 pages of data stored in the flash memory array 12 may be compared to the data in either of first or second memory buffers 14-1 or 14-2 multiplexed through MUX 60 (FIG. 2E) by the compare circuit 50 depicted in FIG. 2D.

Figure 3D:
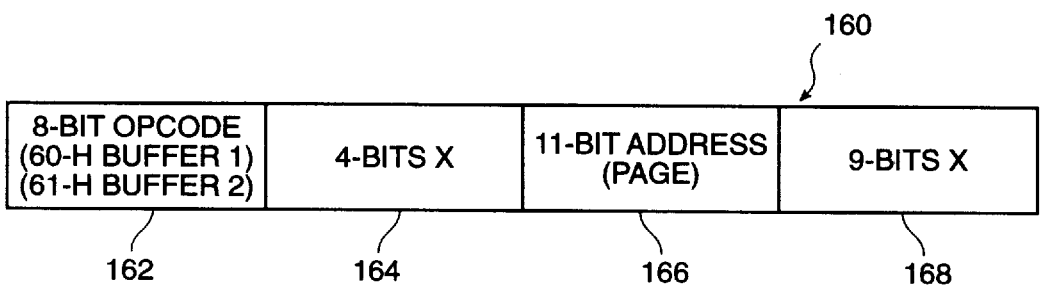
FIG. 3D is a diagram of a main memory page to buffer compare instruction according to the present invention.

A block diagram of the main memory page to buffer compare instruction 160 is illustrated in FIG. 3D. A first portion of the main memory page to buffer compare instruction 160 is an eight bit opcode 162. In the preferred embodiment, the opcode bit pattern to implement a compare with a page in the flash memory array 12 to the first memory buffer 14-1 is 60H, the opcode bit pattern to implement a compare with a page in the flash memory array 12 to the second memory buffer 14-2 is 61H. A second portion of the main memory page to buffer compare instruction 160 is four bits of don't care 164. A third portion of the main memory page to buffer compare instruction 160 is eleven bits of address 166 specifying the address of the page in the flash memory array 12 to be compared to the selected first or second memory buffer 14-1 or 14-2. A fourth portion of the main memory page to buffer compare instruction 160 is nine bits of don't care 168.

Once the main memory page to buffer compare instruction 160 has been toggled in by the CLK, the op-code will be output from the logic block 20 along with the address A9–A19 specified by eleven bits of address 166. The address will be decoded by the flash memory array 12, and on a transition from low to high of the $\overline{CS}$ signal, a comparison of the data in the page in the flash memory array 12 specified by the eleven bits of address 166 will be made to the data in the selected first or second memory buffer 14-1 or 14-2. In the preferred embodiment, the data compare is typically completed in about 120 µs. A bit in the status register (not shown) can be checked to assess whether the data compare has been completed. When data compare is complete, the second most significant bit of the status register is updated and can be checked to assess the result of the data compare.

In a first write mode, buffer write, a multibyte instruction comprising an opcode specifying the buffer write operation to be performed, either the first or second memory buffer 14-1 or 14-2, and the address of the either the first or second memory buffer 14-1 or 14-2 are input to the logic block 20 in the input stream. In the buffer write, data from the input stream fed into the logic block 20 in either serial or parallel and is multiplexed on lines D1–D8 through MUX 40 depicted in FIG. 2C, and written into the selected first or second memory buffer 14-1 or 14-2.

Figure 4A:
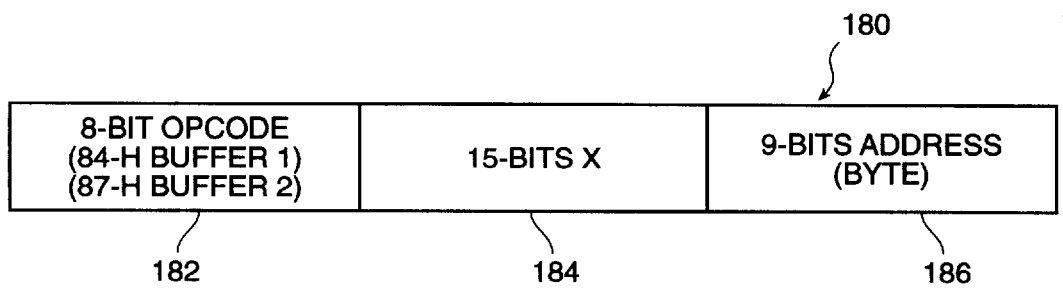
FIG. 4A is a diagram of a buffer write instruction according to the present invention.

A block diagram of the buffer write instruction 180 is illustrated in FIG. 4A. A first portion of the buffer write instruction 180 is an eight bit opcode 182. In the preferred embodiment, the opcode bit pattern to write to the first memory buffer 14-1 is 84H, and the opcode to write to the second memory read buffer 14-2 is 87H. A second portion of the buffer write instruction 180 is fifteen bits of don't care 184. A third portion of the buffer write instruction 180 is nine bits of address 186 specifying the address of the first byte to be written to the selected first or second memory buffer 14-1 or 14-2.

Once the buffer write instruction 180 has been toggled in by the CLK signal, the opcode will be output from the logic block 20 along with either the address $A0_1$–$A_{81}$ or $A0_2$–$A8_2$ (depending on whether the data is written to either the first or second memory buffer 14-1 or 14-2) specified by nine bits of address 186. If the end of the selected first or second memory buffer 14-1 or 14-2 is reached during the write operation, the write operation will then begin write at the start of the selected memory buffer. The write operation will continue until the $\overline{CS}$ signal makes a transition from low to high. When the $\overline{CS}$ signal makes the transition from low to high the write stops, and the I/O of the logic block 20 will be placed in a high impedance state.

In a second write mode, buffer transfer to main memory page with built-in erase, a multibyte instruction comprising an opcode specifying the main memory page to buffer transfer operation to be performed and the selected first or second memory buffer 14-1 or 14-2, and the address of the page in the flash memory array 12 are input to the logic block 20 in the input stream. In the buffer transfer to main memory page with built-in erase, one of the 2048 pages of data stored in the flash memory array 12 is erased, and then in the same cycle, data in either of first or second memory buffers 14-1 or 14-2 is multiplexed through a MUX 60 depicted in FIG. 2E, and written, commonly referred to by those of ordinary skill in the art as programming, a byte at a time as DBFR1–8 into the erased page in the flash memory array 12.

Figure 4B:
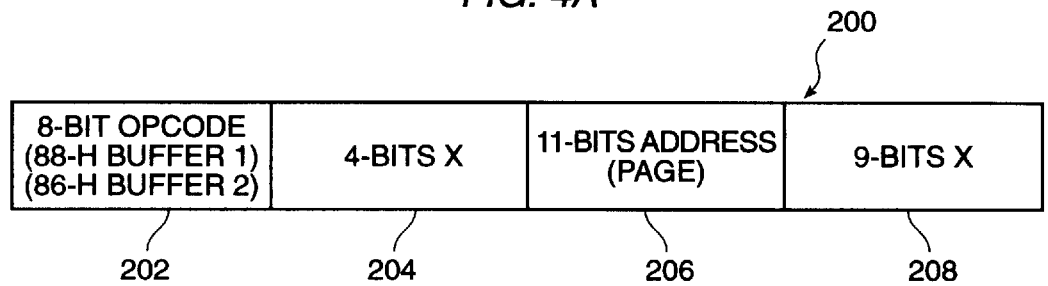
FIG. 4B is a diagram of a buffer transfer to main memory page with built-in erase instruction according to the present invention.

A block diagram of the buffer transfer to main memory page with built-in erase instruction 200 is illustrated in FIG. 4B. A first portion of the buffer transfer to main memory page with built-in erase instruction 200 is an eight bit opcode 202. In the preferred embodiment, the opcode bit pattern to implement a transfer from the first memory buffer 14-1 to the flash memory array 12 is 83H, and the opcode bit pattern to implement a transfer from the second memory buffer 14-2 to the flash memory array 12 is 86H. A second portion of the buffer transfer to main memory page with built-in erase instruction 200 is four bits of don't care 204. The third portion of the buffer transfer to main memory page with built-in erase instruction 200 is an eleven bit address 206 specifying the page in the flash memory array 12 to be erased, and the address of the page in the flash memory array 12 to be written to from the selected first or second memory buffer 14-1 or 14-2. A fourth portion of the buffer transfer to main memory page with built-in erase instruction 200 is nine bits of don't care 208.

Once the buffer transfer to main memory page with built-in erase instruction 200 has been toggled in by the CLK, the opcode will be output from the logic block 20 along with the address A9–A19 specified by eleven bits of address 206. The address will be decoded by the flash memory array 12, and on a transition from low to high of the $\overline{CS}$ signal, an erase of the page in the flash memory array 12 specified by eleven bits of address 206 will be made. When the erase is completed, a transfer of the data will begin from the selected first or second memory buffer 14-1 or 14-2 to the erased page in the flash memory array 12 specified by eleven bits of address 206. Both the erase and the data transfer occur in the same cycle and are internally self-timed. In the preferred embodiment, the erase and programming is typically completed in about 10 ms. A status bit in the status register can be checked to assess whether the programming has been completed.

In a third write mode, buffer transfer to main memory page without built-in erase, a multibyte instruction comprising an opcode specifying the buffer to main memory page operation without built-in erase to be performed and the selected first or second memory buffer 14-1 or 14-2, and the address of the page in the flash memory array 12 are input to the logic block 20 in the input stream. In the buffer transfer to main memory page without built-in erase, data in either of first or second memory buffers 14-1 or 14-2 is multiplexed through MUX 60, and programmed a byte at a time as DBFR1–8 into a previously erased page in the flash memory array 12.

Figure 4C:
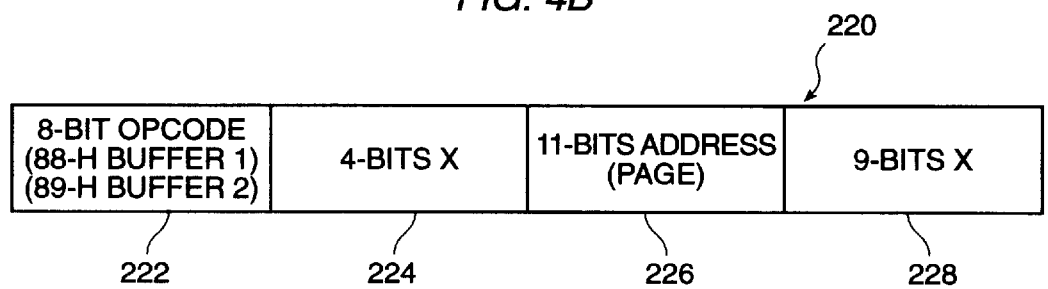
FIG. 4C is a diagram of a buffer transfer to main memory page without built-in erase according to the present invention.

A block diagram of the buffer transfer to main memory page without built-in erase instruction 220 is illustrated in FIG. 4C. A first portion of the buffer transfer to main memory page without built-in erase instruction 220 is an eight bit opcode 222. In the preferred embodiment, the opcode bit pattern to implement a transfer from the first memory buffer 14-1 to the flash memory array 12 is 88H, and the opcode bit pattern to implement a transfer from the second memory buffer 14-2 to the flash memory array 12 is 89H. A second portion of the buffer transfer to main memory page without built-in erase instruction 220 is four bits of don't care 224. A third portion of the buffer transfer to main memory page without built-in erase instruction 220 is eleven bits of address 226 specifying the address of the page in the flash memory array 12 to be written to from the selected first or second memory buffer 14-1 or 14-2. A fourth portion of the buffer transfer to main memory page without built-in erase instruction 220 is nine bits of don't care 228.

Once the buffer transfer to main memory page without built-in erase instruction 220 has been toggled in by the CLK, the opcode will be output from the logic block 20 along with the address A9–A19 specified by eleven bits of address 226. The address will be decoded by the flash memory array 12, and on a transition from low to high of the $\overline{CS}$ signal, a transfer of the data will begin from the selected first or second memory buffer 14-1 or 14-2 to the previously erased page in the flash memory array 12 specified by eleven bits of address 226. The data transfer is internally self-timed. In the preferred embodiment, the data transfer is typically completed in about 7 ms. A status bit in the status register can be checked to assess whether the data transfer has been completed.

In a fourth write mode, main memory page program, a multibyte instruction comprising an opcode specifying the main memory page program operation to be performed, the address of the page in the flash memory array 12 and the address of a selected first or second memory buffer 14-1 or 14-2 are input to the logic block 20 in the input stream. In the main memory page program, data from the input stream is fed into the logic block 20 in either serial or parallel and is multiplexed on lines D1–D8 through MUX 40, and written into the selected first or second memory buffer 14-1 or 14-2. Next, one of the 2048 pages of data stored in the flash memory array 12 is erased, and then in the same cycle, data in either of first or second memory buffers 14-1 or 14-2 is multiplexed through MUX 60 and programmed a byte at a time as DBFR1–8 into the erased page in the flash memory array 12.

Figure 4D:
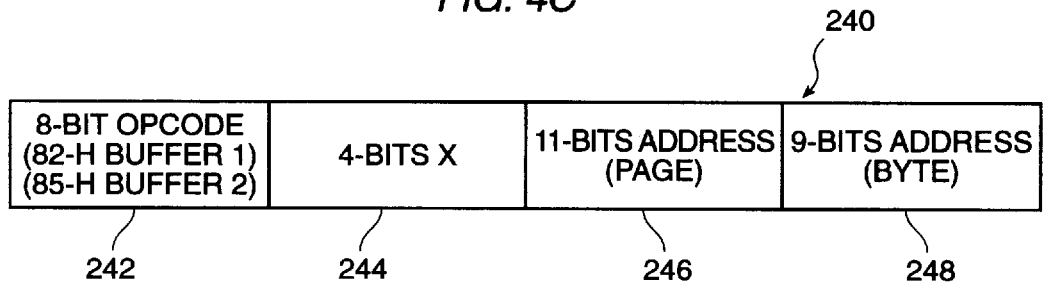
FIG. 4D is a diagram of a main memory page program instruction according to the present invention.

A block diagram of the main memory page program instruction 240 is illustrated in FIG. 4D. A first portion of the main memory page program instruction 240 is an eight bit opcode 242. In the preferred embodiment, the opcode bit pattern to implement a write to the first memory buffer 14-1 and then a transfer from the first memory buffer 14-1 to the flash memory array 12 is 82H, and the opcode bit pattern to implement a write to the second memory buffer 14-2 and then a transfer from the second memory buffer 14-2 to the flash memory array 12 is 85H. A second portion of the main memory page program instruction 240 is four bits of don't care 244. A third portion of the main memory page program instruction 240 is eleven bits of address 246 specifying the address of the page in the flash memory array 12 to be written to from the selected first or second memory buffer 14-1 or 14-2. A fourth portion of the main memory page program instruction 240 is nine bits of address 248 specifying the address of the first byte in the selected first or second memory buffer 14-1 or 14-2 into which data is written.

Once the main memory page program instruction 240 has been toggled in by the CLK, the opcode will be output from the logic block 20 along with the address A9–A19 specified by eleven bits of address 246 and either the address $A0_1$–$A8_1$ or $A0_2$–$A8_2$ (depending on whether the data is written to the first or second memory buffer 14-1 or 14-2) specified by nine bits of address 248. Next, writing of the data, starting at the address specified by nine bits of address 248 will begin. If the end of the selected first or second memory buffer 14-1 or 14-2 is reached during the write operation, the write operation will then begin to write at the start of the selected memory buffer. The write operation will continue until the $\overline{CS}$ signal makes a transition from low to high. The transition from low to high of the $\overline{CS}$ signal stops the write operation to the selected first or second memory buffer 14-1 or 14-2, and initiates an erase of the page in the flash memory array 12 specified by eleven bits of address 246. When the erase is completed, the programming of data will begin from the selected first or second memory buffer 14-1 or 14-2 to the erased page in the flash memory array 12 specified by eleven bits of address 246. Both the erase and the programming occur in the same cycle and are internally self-timed. In the preferred embodiment, the erase and programming is typically completed in about 10 ms. A most significant bit in the status register can be checked to assess whether the erase and data transfer has been completed.

In the auto page rewrite mode, a multibyte instruction comprising an opcode specifying the auto page rewrite operation to be performed and the selected first or second memory buffer 14-1 or 14-2, and the address of the page in the flash memory array 12 are input to the logic block 20 in the input stream. In the auto page rewrite, the data in one of the 2048 pages of data stored in the flash memory array 12 is read and multiplexed through MUX 40, and written into either of first or second memory buffers 14-1 or 14-2. The page of data in the flash memory array 12 just read is erased, and then in the same cycle, the data in the selected first or second memory buffer 14-1 or 14-2 is multiplexed through MUX 60 and programmed a byte at a time as DBFR1–8 into the erased page in the flash memory array 12.

Figure 5:
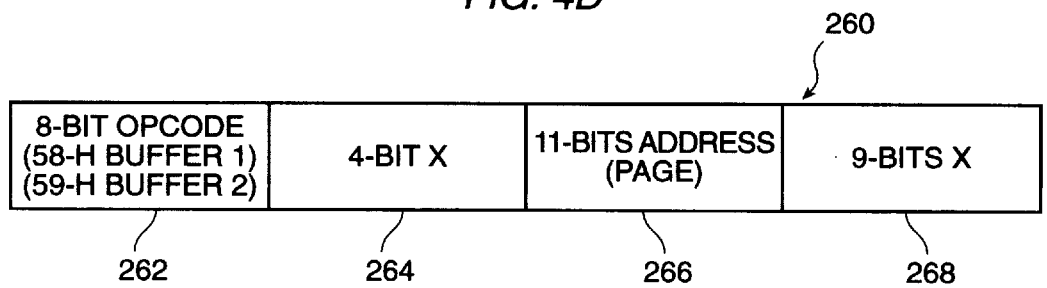
FIG. 5 is a diagram of a auto page rewrite instruction according to the present invention.

A block diagram of the auto page rewrite instruction 260 is illustrated in FIG. 5. A first portion of the auto page rewrite instruction 260 is an eight bit opcode 262. In the preferred embodiment, the opcode bit pattern to implement a transfer from the flash memory array 12 to the first memory buffer 14-1 is 58H, and the opcode bit pattern to implement a transfer from the flash memory array 12 to the second memory buffer 14-2 is 59H. A second portion of auto page rewrite instruction 260 is four bits of don't care 264. A third portion of auto page rewrite instruction 260 is eleven bits of address 266 specifying the address of the page in the flash memory array 12 to be read, and then written into the selected first or second memory buffer 14-1 or 14-2. The third portion 266 also specifies the page in the flash memory array 12 to be erased and the address of the page in the flash memory array 12 to be written to from the selected first or second memory buffer 14-1 or 14-2. A fourth portion of auto page rewrite instruction 260 is nine bits of don't care 268.

Once the auto page rewrite instruction 260 has been toggled in by CLK, the opcode will be output from the logic block 20 along with the page address A9–A19 specified by eleven bits of address 266. The address will be decoded by the flash memory array 12, and on a transition from low to high of the $\overline{CS}$ signal, a transfer of the page in the flash memory array 12 specified by eleven bits of address 266 will be made to the selected first or second memory buffer 14-1 or 14-2, and an erase of the page in the flash memory array 12 specified by eleven bits of address 266 will be made. When the erase is completed, a transfer of the data will begin from the selected first or second memory buffer 14-1 or 14-2 to the erased page in the flash memory array 12 specified by eleven bits of address 266. The transfer of the data from page in the flash memory array 12, the erase and the programming occur in the same cycle and are internally self-timed. In the preferred embodiment, the erase and programming is typically completed in about 10 ms. A status bit in the status register can be checked to assess whether the programming has been completed.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A flash memory array architecture comprising:
   a flash memory array having first and second pluralities of input/output conductors;
   a first memory buffer having first and second pluralities of input/output conductors, said first plurality of input/output conductors connected to said first plurality of input/output conductors of said flash memory array;
   a second memory buffer having first and second pluralities of input/output conductors, said first plurality of input/output conductors connected to said second plurality of input/output conductors of said flash memory array; and
   an input/output interface circuit having first and second pluralities of input/output conductors, said first plurality of input/output conductors connected to said second plurality of input/output conductors of said first memory buffer, and said second plurality of input/output conductors connected to said second plurality of input/output conductors of said second memory buffer.

2. The flash memory array architecture as in claim 1 wherein said input/output interface circuit further includes a third plurality of input/output conductors.

3. The flash memory array architecture as in claim 1 further including an output conductor from said flash memory array to said input/output interface circuit.

4. The flash memory array architecture as in claim 3 wherein said output conductor from said flash memory array to said input/output interface circuit is a plurality of output conductors.

5. A flash memory array architecture comprising:
- a flash memory array having first and second input/output conductors;
- a first memory buffer having first and second input/output conductors, said first input/output conductor connected to said first input/output conductor of said flash memory array;
- a second memory buffer having first and second input/output conductors, said first input/output conductor connected to said second input/output conductor of said flash memory array; and
- an input/output interface circuit having first and second input/output conductors, said first input/output conductor connected to said second input/output conductor of said first memory buffer, and said second input/output conductor connected to said second input/output conductor of said second memory buffer.

6. The flash memory array architecture as in claim 5 further including an output conductor from said flash memory array to said input/output interface circuit.

7. The flash memory array architecture as in claim 6 wherein said output conductor from said flash memory array to said input/output interface circuit is a plurality of output conductors.

8. The flash memory array architecture as in claim 5 wherein said first input/output conductor of said flash memory array and said first input/output conductor of said first memory buffer are pluralities of conductors.

9. The flash memory array architecture as in claim 5 wherein said second input/output conductor of said flash memory array and said first input/output conductor of said second memory buffer are pluralities of conductors.

10. The flash memory array architecture as in claim 5 wherein said second input/output conductor of said first memory buffer and said first input/output conductor of said input/output interface circuit are pluralities of conductors.

11. The flash memory array architecture as in claim 5 wherein said second input/output conductor of said second memory buffer and said second input/output conductor of said input/output interface circuit are pluralities of conductors.

12. A flash memory array architecture comprising:
- a flash memory array having an input/output conductor;
- a multiplexer having first, second and third input/output conductors, said first input/output conductor of said multiplexer connected to said input/output conductor of said flash memory array;
- a first memory buffer having first and second input/output conductors, said first input/output conductor connected to said second input/output conductor of said multiplexer;
- a second memory buffer having first and second input/output conductors, said first input/output conductor connected to said third input/output conductor of said multiplexer; and
- an input/output interface circuit having first and second input/output conductors, said first input/output conductor connected to said second input/output conductor of said first memory buffer, and said second input/output conductor connected to said second input/output conductor of said second memory buffer.

13. The flash memory array architecture as in claim 12 further including an output conductor from said flash memory array to said input/output interface circuit.

14. The flash memory array architecture as in claim 13 wherein said output conductor from said flash memory array to said input/output interface circuit is a plurality of output conductors.

15. The flash memory array architecture as in claim 12 wherein said input/output conductor of said flash memory array and said first input/output conductor of said multiplexer are pluralities of conductors.

16. The flash memory array architecture as in claim 12 wherein said second input/output conductor of said multiplexer and said first input/output conductor of said first memory buffer are pluralities of conductors.

17. The flash memory array architecture as in claim 12 wherein said third input/output conductor of said multiplexer and said first input/output conductor of said second memory buffer are pluralities of conductors.

18. The flash memory array architecture as in claim 12 wherein said second input/output conductor of said first memory buffer and said first input/output conductor of said input/output interface circuit are pluralities of conductors.

19. The flash memory array architecture as in claim 12 wherein said second input/output conductor of said second memory buffer and said second input/output conductor of said input/output interface circuit are pluralities of conductors.

20. A flash memory array architecture comprising:
- a flash memory array having first and second input/output conductors;
- a first memory buffer having first and second input/output conductors, said first input/output conductor connected to said first input/output conductor of said flash memory array;
- a second memory buffer having first and second input/output conductors, said first input/output conductor connected to said second input/output conductor of said flash memory array;
- a multiplexer having first, second and third input/output conductors, said first input/output conductor of said multiplexer connected to said second input/output conductor of said first memory buffer and said second input/output conductor of said multiplexer connected to said second input/output conductor of said second memory buffer; and
- an input/output interface circuit having a first input/output conductor connected to said third input/output conductor of said multiplexer.

21. The flash memory array architecture as in claim 20 further including an output conductor from said flash memory array to said input/output interface circuit.

22. The flash memory array architecture as in claim 21 wherein said output conductor from said flash memory array to said input/output interface circuit is a plurality of output conductors.

23. The flash memory array architecture as in claim 20 wherein said first input/output conductor of said flash memory array and said first input/output conductor of said first memory buffer are pluralities of conductors.

24. The flash memory array architecture as in claim 20 wherein said second input/output conductor of said flash memory array and said first input/output conductor of said second memory buffer are pluralities of conductors.

25. The flash memory array architecture as in claim 20 wherein said second input/output conductor of said first memory buffer and said first input/output conductor of said multiplexer are pluralities of conductors.

26. The flash memory array architecture as in claim 20 wherein said second input/output conductor of said second memory buffer and said second input/output conductor of said multiplexer are pluralities of conductors.

27. The flash memory array architecture as in claim 20 wherein said third input/output conductor of said multiplexer and said input/output conductor of said input/output interface circuit are pluralities of conductors.

28. A flash memory array architecture comprising:
a flash memory array having an input/output conductor;
a first multiplexer having first, second and third input/output conductors, said first input/output conductor of said first multiplexer connected to said input/output conductor of said flash memory array;
a first memory buffer having first and second input/output conductors, said first input/output conductor connected to said second input/output conductor of said first multiplexer;
a second memory buffer having first and second input/output conductors, said first input/output conductor connected to said third input/output conductor of said first multiplexer;
a second multiplexer having first, second and third input/output conductors, said first input/output conductor of said second multiplexer connected to said second input/output conductor of said first memory buffer and said second input/output conductor of said second multiplexer connected to said second input/output conductor of said second memory buffer; and
an input/output interface circuit having a first input/output conductor connected to said third input/output conductor of said second multiplexer.

29. The flash memory array architecture as in claim 28 further including an output conductor from said flash memory array to said input/output interface circuit.

30. The flash memory array architecture as in claim 29 wherein said output conductor from said flash memory array to said input/output interface circuit is a plurality of output conductors.

31. The flash memory array architecture as in claim 28 wherein said input/output conductor of said flash memory array and said first input/output conductor of said first multiplexer are pluralities of conductors.

32. The flash memory array architecture as in claim 28 wherein said second input/output conductor of said first multiplexer and said first input/output conductor of said first memory buffer are pluralities of conductors.

33. The flash memory array architecture as in claim 28 wherein said third input/output conductor of said first multiplexer and said first input/output conductor of said second memory buffer are pluralities of conductors.

34. The flash memory array architecture as in claim 28 wherein said second input/output conductor of said first memory buffer and said first input/output conductor of said second multiplexer are pluralities of conductors.

35. The flash memory array architecture as in claim 28 wherein said second input/output conductor of said second memory buffer and said second input/output conductor of said second multiplexer are pluralities of conductors.

36. The flash memory array architecture as in claim 28 wherein said third input/output conductor of said second multiplexer and said input/output conductor of said input/output interface circuit are pluralities of conductors.

37. A method for operating a flash memory array having a first buffer and a second buffer comprising the steps of:
writing first data to said first buffer;
writing said first data from said first buffer to a first page in said flash memory array; and
writing second data to said second memory buffer while said first data is being written to said flash memory array.

38. A method for operating a flash memory array as in claim 37, further including the step of:
writing said second data from said second buffer to a second page in said flash memory array.

39. A method for operating a flash memory array having a first buffer and a second buffer comprising the steps of:
writing first data to said first buffer;
writing said first data from said first buffer to a first page in said flash memory array;
writing second data to said second memory buffer while said first data is being written to said flash memory array;
checking to determine whether said first data has been written to said flash memory array;
erasing a second page in said flash memory array; and
writing said second data from said second buffer to said second page in said flash memory array.

40. A method for operating a flash memory array having a first buffer and a second buffer comprising the steps of:
writing first data to said first buffer;
erasing a first page in said flash memory array;
writing said first data from said first buffer to said first page in said flash memory array;
checking to determine whether said first data has been written to said flash memory array; and
writing second data to said second memory buffer while said first data is being written to said flash memory array.

41. A method for operating a flash memory array as in claim 40, further including the step of:
writing said second data from said second buffer to a second page in said flash memory array.

42. A method for operating a flash memory array having a first buffer and a second buffer comprising the steps of:
writing data to said first buffer;
writing said data from said first buffer to a page in said flash memory array; and
comparing said page in said flash memory array to which said data has been written with said data in said first buffer.

43. A method for operating a flash memory array as in claim 42, further including the step of:
checking to determine whether writing said data to said flash memory array has been completed.

44. A method for operating a flash memory array as in claim 42, further including the step of:
checking to determine whether a match between said page in said flash memory array to which said data has been written and said data block in said first buffer has occurred.

45. A method for operating a flash memory array as in claim 43, further including the step of:
checking to determine whether a match between said block written into said flash memory array and said data block in said first buffer has occurred.

46. A method for providing a continuous stream of data to a non-volatile memory array comprising the steps of:
writing first data to a first volatile memory;
writing said first data from said first volatile memory to said non-volatile memory array; and
writing second data to a second volatile memory while said first data is being written to said non-volatile memory array.

47. A method for operating a non-volatile memory array comprising the steps of:

transferring first data out of a first memory buffer to said non-volatile memory array; and transferring second data into a second memory buffer while said first data is being transferred out of said first memory buffer.

48. A method for operating a non-volatile memory array comprising the steps of:

transferring first data into a first memory buffer from said non-volatile memory array; and transferring second data into a second memory buffer while said first data is being transferred into said first memory buffer.

49. A method for operating a non-volatile memory array comprising the steps of:

transferring data into a first memory buffer from said non-volatile memory array;

writing to selected data positions in said first memory buffer; and transferring data out of said first memory buffer to said non-volatile memory array.

50. A method for operating a flash memory array as in claim 49, further including the step of:

transferring data into a second memory buffer while said data is being transferred out of said first memory buffer.

51. A method for operating a non-volatile memory array comprising the steps of:

transferring data into a first memory buffer from a page in said non-volatile memory array;

writing to selected data positions in said first memory buffer; and transferring data out of said first memory buffer to said page in non-volatile memory array.

52. A method for operating a flash memory array as in claim 51, further including the step of:

erasing said page in said non-volatile memory array.

* * * * *

UNITED STATES PATENT AND TRADEMARK OFFICE
CERTIFICATE OF CORRECTION

PATENT NO. : 5,822,245
DATED : October 13, 1998
INVENTOR(S) : Anil Gupta and Steven J. Schumann It is certified that error appears in the above-identified patent and that said Letters Patent is hereby corrected as shown below:

On the title page, Item [57],

In the abstract:

column 2, lines 10 through 15: delete the phrase "data from an input stream is written into a selected first or second memory buffer, one of the pages of data stored in the flash memory array is erased, and then in the same cycle, data in either of first or second memory buffers is written into the erased page in the flash memory array.".

In the drawings:

In FIG. 2A: please replace "CSs" with --Cs--.
In FIG. 4B: please replace "(88-H BUFFER 1)" with --(83-H BUFFER 1)--.

Column 4, line 3: please replace "bytes 5" with --bytes--.
Column 7, line 4: please replace "read buffer" with --buffer--.
Column 7, line 25: please replace "page to buffer" with --page for buffer--.

Signed and Sealed this

Fifteenth Day of June, 1999

Attest:

Q. TODD DICKINSON

Attesting Officer

Acting Commissioner of Patents and Trademarks